United States Patent [19]
Yeadon et al.

[11] Patent Number: 5,162,926
[45] Date of Patent: Nov. 10, 1992

[54] REGISTRATION METHOD

[75] Inventors: Edward C. Yeadon; Raymond Turner, both of London, England

[73] Assignee: Crossfield Electronic Ltd., England

[21] Appl. No.: 537,956

[22] Filed: Jun. 13, 1990

[30] Foreign Application Priority Data

Jun. 13, 1989 [GB] United Kingdom ............ 8913575

[51] Int. Cl.$^5$ .............................................. H04N 1/04
[52] U.S. Cl. ........................................ 358/492; 355/75
[58] Field of Search ............... 358/492, 493, 494, 488, 358/497; 355/75, 76, 72, 230; 271/232, 18.1, 193, 226, 245; 269/8

[56] References Cited

U.S. PATENT DOCUMENTS

Re. 33,329 9/1990 Ishii ................................. 271/245
4,931,826 6/1990 Lucht et al. ........................ 355/72

FOREIGN PATENT DOCUMENTS 2202186 9/1988 United Kingdom .

OTHER PUBLICATIONS

Patent Abstracts of Japan, No. 59-42548.

Primary Examiner—Jin F. Ng
Assistant Examiner—Dov Popovici
Attorney, Agent, or Firm—Sughrue, Mion, Zinn, Macpeak & Seas

[57] ABSTRACT

A sheet carrying assembly comprises a platen and a carrier secured to the platen by a vacuum. The registration of the carrier on the platen is achieved by use of magnets. The magnets have fixed positions on the platen so that the carrier will always be properly positioned. In a sheet carrying system a set of interchangeable carriers is provided which have attachment means in different positions for different sheets. Such a system is particularly useful in facsimile transmission of films.

10 Claims, 2 Drawing Sheets

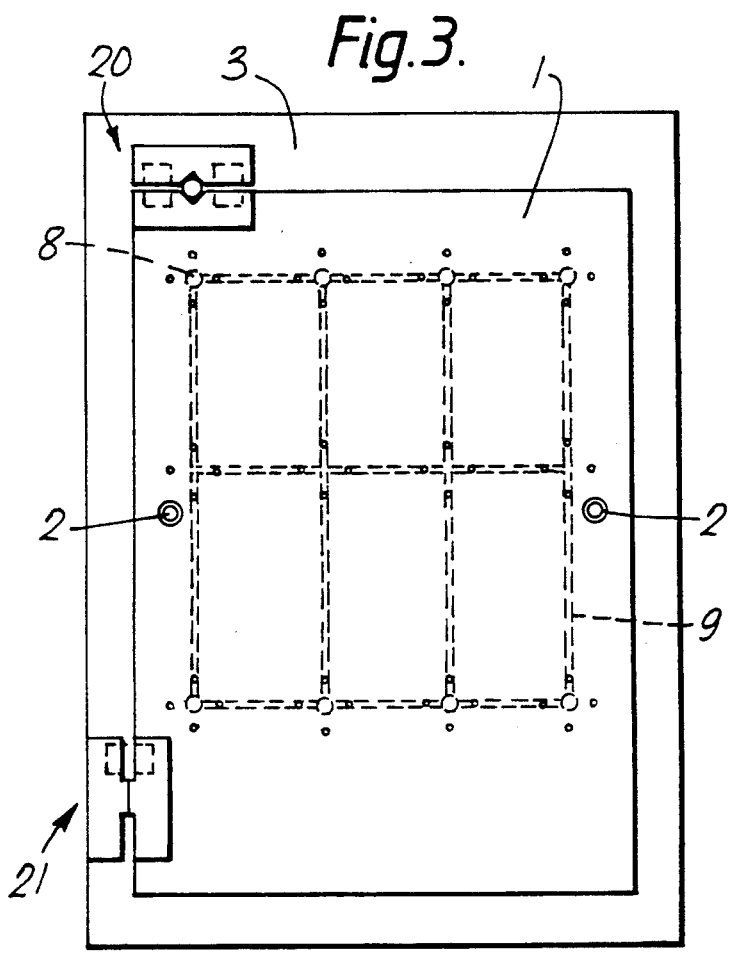
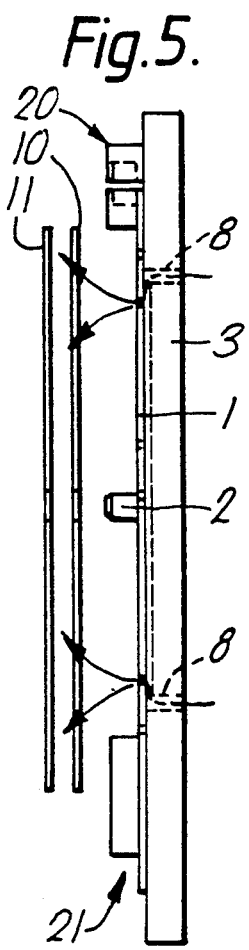
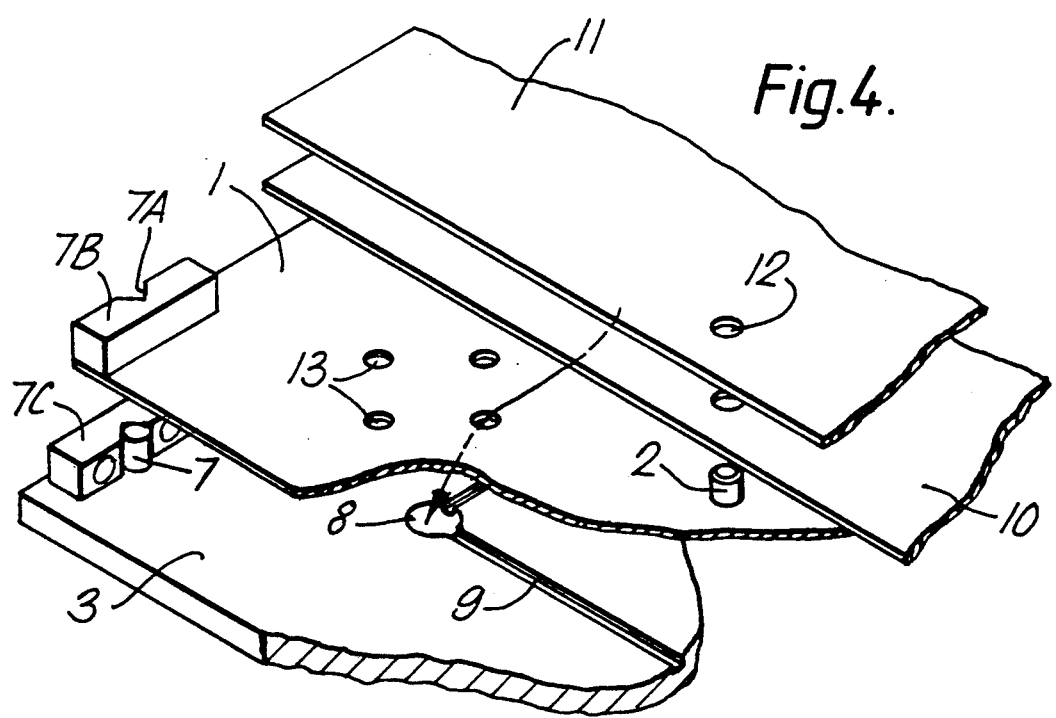

REGISTRATION METHOD

FIELD OF THE INVENTION

The invention relates to registration of colour separations in particular punched output films for facimile transmission.

DESCRIPTION OF THE PRIOR ART

Facsimile transmission of 4-colour separations must preserve the register between the punched output films. This registering can be done, visually by keeping an eye on the image structure or on prepared marks which form part of the transmitted image. The writer can punch holes in the output film, and these can be used for registering, or for registered location on a transfer punch in order to make new register punch holes in different positions as may be required for plate making. It is obviously necessary to have the original films consistently and accurately positioned on the reader platen, and the original separation films are invariably punched with register holes which make this convenient. There are many different standards of register hole punch systems, however, with holes of different diameters in different positions relative to the image. This makes it impractical to have pins permanently located in fixed positions on the reader. Common practice is to use one of a number of possible solutions:

1. Temporarily fix pins to the platen using adhesive tape. It is difficult to re-establish the same pin positions at a later time.

2. Use removable pins, either screwed or precision fitting in holes in the platen. This is restrictive to prepared positions, and the pins fixings can wear, reducing the accuracy of location.

An example of this arrangement is shown in JP-59-42548.

3. Replacable pin bars around the edges of the platen. This can work well but is expensive.

A further complication arises when laterally reversed images are needed, and where economical use of film requires film of different width being used for the transmission of different size images. When the line of pixel data is reversed, an off-centre image will shift to the other side of the centre line. This puts the image in a different position relative to holes punched in the film and, in extreme cases, can put the image off the edge of the film.

GB-A-2202186 describes a ferromagnetic strip for a stencil which can fix an end or sides of the stencil to a magnetic drum. These strips allow the stencil to be attached to any part of the magnetic drum and do not provide lateral registration.

SUMMARY OF THE INVENTION

In accordance with the present invention a sheet carrying assembly comprises a platen; a carrier for carrying a sheet; means to secure said carrier to said platen; magnetic registration means to register said carrier on said platen; and attachment means to attach a sheet to said carrier.

This provides an accurate way of aligning successive colour separations which may have different positions and means for attachment to the carrier. It has been found that the magnetic restraint is particularly convenient to use—it gives adequate holding force and "snaps" in to the register position, it is easy to release by pulling apart with very little hand force, there is no spring catch location mechanism to release first and which might cause wear. The platen and carrier may have magnetic registration means in the form of a magnet and cooperating magnetic member with the magnet positioned on either of the platen or the carrier but, preferably the magnetic registration means comprises magnets on each of the carrier and platen. Typically, the attachment means comprise one or more pins and vacuum means form part of the attachment means fixed to the carrier.

The invention is particularly suited to a sheet carrying system comprising a platen, a set of carriers each having attachment means to hold respectively different sheets; means to secure said carrier to said platen; and magnetic registration means to register said carrier on said platen. In this way a single platen/carrier registration means is required for all sheets.

An example of a sheet carrying assembly in accordance with the present invention, will now be described with reference to the accompanying drawings, in which:

BRIEF DESCRIPTION OF THE DRAWINGS

FIG. 3 shows a carrier mounted on the platen with the vacuum carrying grooves shown in phantom;

FIG. 4 is an exploded, partial view of the platen, carrier and sheet; and,

FIG. 5 is a partially exploded side elevation.

EMBODIMENT

Figure 1:
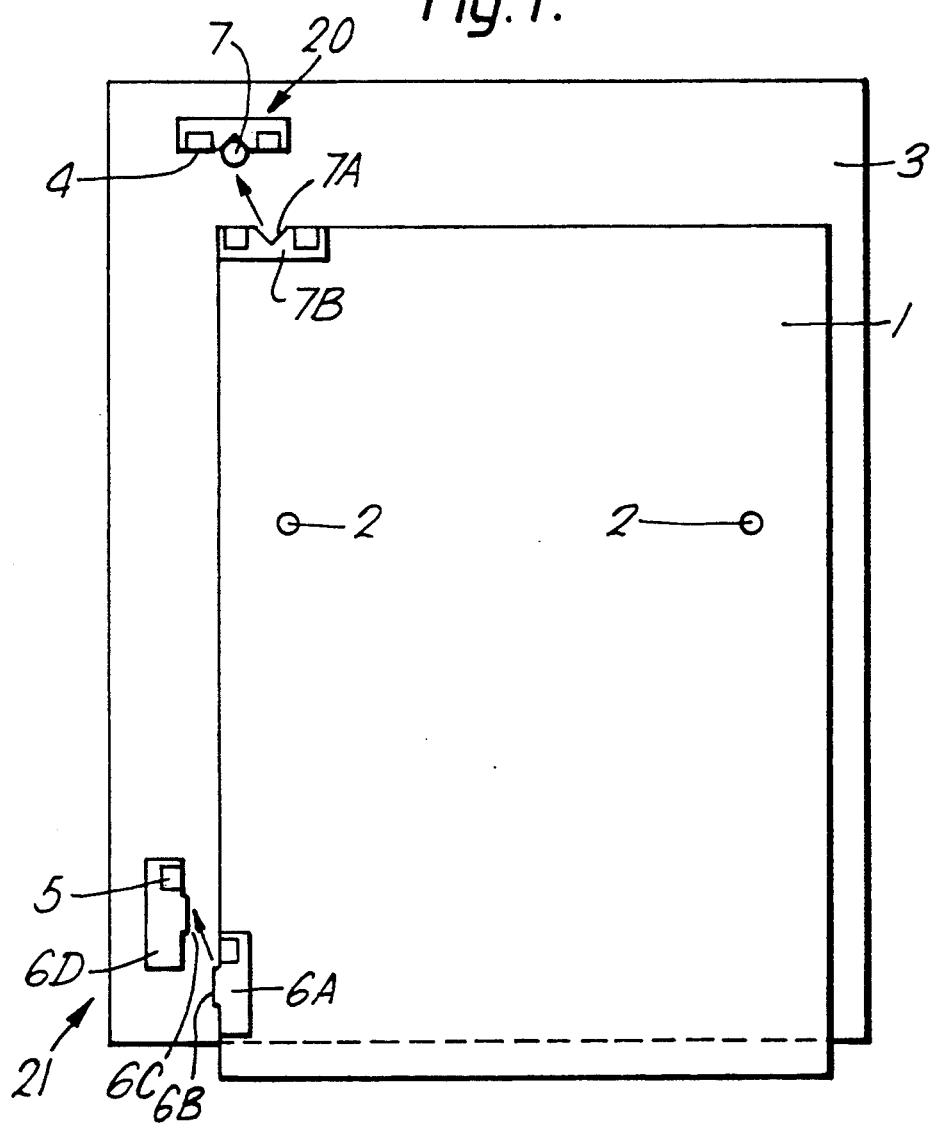
FIG. 1 shows a complete sheet carrying assembly having a single carrier.

FIG. 1 shows a sheet carrying assembly comprising a platen 3, and a carrier 1 of a glass reinforced plastic carrying register pins 2 for a sheet such as a film transparency set in fixed positions suitable for the film to be carried. There are holes 13 1A (FIG. 4) through the carrier 1 in positions directly over vacuum grooves 9 in the platen 3 for holding the sheet firmly on the platen. When the sheet is a film 11, a white paper underlay 10 may be used.

The carrier 1 is kinematically located on the platen 3 by means of two registration assemblies 20,21; as there are three degrees of freedom to be constrained (two translations and one rotation). The assembly 20 comprises a pin 7 which locates in a vee-groove 7A in a block 7B supported on the carrier 1, while the assembly 21 comprises a block 6A providing a butting surface 6B which rests on a plane 6C of a block 6D secured to the platen 3. Small permanent magnets 4,5 are used to give a holding force for these kinematic locations. The pin 7 and the plane 6 are fixed permanently in datum positions on the platen 3, and the position of the scanned image is adjusted correctly to this datum once and for all in setting up the reader. The pinned carrier 1 will locate to the datum as shown in FIG. 1.

Figure 2A:
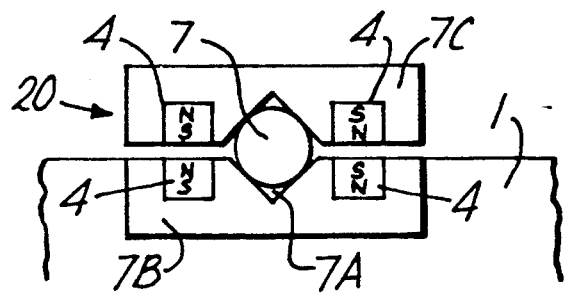
FIGS. 2A and 2B are plan views of the magnetic registration means.

In the assembly 20 shown in FIG. 2A two pairs of magnets 4 are situated one on either side of the pin 7 and V groove 7A in the blocks 7B, 7C and it is arranged such that the magnets 4 have opposite polarity to further reduce the chance of mis-registration of the carrier 1 with the platen 3. By arranging the two pairs of magnets to be opposite polarity, any tendency for the magnets to "catch" in a non-registered position is avoided.

Figure 2B:
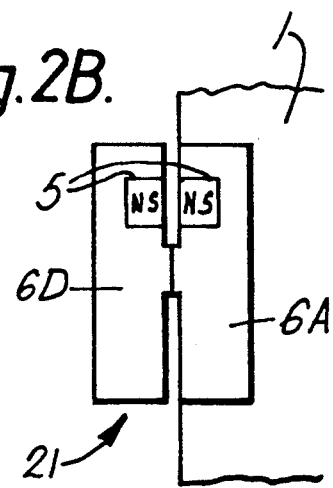

In the assembly 21 shown in FIG. 2B a single pair of magnets 5 is provided, one on each block 6A, 6D.

The film 11 and carrier 1 are held on the platen by vacuum provided via openings 8 in the platen 3 to vacuum registration grooves 9 across the surface of the platen (FIG. 3). In the example (FIGS. 4 and 5) the white paper underlay 10 is porous so that the vacuum holding the carrier 1 in place also helps to keep the film 11 on the carrier 1 through the porous underlay via holes 13 in the carrier. The film 11 and underlay 10 both have holes 12 to cooperate with the register pins 2 of the carrier.

In application to facsimile transmission, a separate carrier is prepared for each of the register pin arrangements required. These carrier sheets should be relatively cheap and can be added at any time. On each sheet, the register pins will be dimensioned to the kinematic locations which engage with the datum pin etc. in the platen. The problem with lateral reverse and different film width, described above, will be overcome by having a different carrier sheet with the pins over at the other side of the platen, "reflected" about centre line of the scanned image. Although the invention is directed towards registration of a variety of films for facsimile transmission, such a registration system could be used in other applications.

We claim:

1. A sheet carrying assembly comprising:
   a platen;
   a carrier for carrying a sheet;
   attachment means to attach a sheet to said carrier; and
   securement means for securing said carrier to said platen including magnetic registration means to register and at least partially secure said carrier on said platen, wherein said magnetic registration means comprises at least one magnet on said platen which cooperates with a magnetic member on said carrier, and wherein said magnetic registration means further comprises at least one pin and groove on said platen which cooperate with a groove on said carrier.

2. An assembly according to claim 1, wherein said magnetic member comprises a magnet.

3. An assembly according to claim 1, wherein said attachment means comprises one or more pins fixed on said carrier.

4. An assembly according to claim 1, wherein said attachment means is formed in part by vacuum means.

5. An assembly according to claim 1, wherein said magnetic registration means applies a force substantially parallel to said platen.

6. A sheet carrying assembly comprising:
   a platen;
   a carrier for carrying a sheet;
   attachment means to attach a sheet to said carrier; and
   securement means for securing said carrier to said platen, said securement means comprising magnetic registration means to register and at least partially secure said carrier on said platen, and wherein said securement means further comprises vacuum means.

7. A sheet carrying system comprising:
   a platen;
   a set of carriers each having attachment means to hold respectively different sheets;
   securement means for securing each of said carriers to said platen, said securement means comprising magnetic registration means to register and at least partially secure each of said carriers on said platen, and wherein said securement means further comprises vacuum means.

8. A sheet carrying system according to claim 7, wherein said magnetic registration means applies a force substantially parallel to said platen.

9. An image scanning apparatus comprising:
   a platen;
   a set of carriers each having attachment means to hold respectively different sheets;
   securement means for securing each of said carriers to said platen, said securement means comprising magnetic registration means to register and at least partially secure each of said carriers on said platen, and wherein said securement means further comprises vacuum means.

10. An image scanning apparatus according to claim 9, wherein said magnetic registration means applies a force substantially parallel to said platen.

* * * * *